United States Patent
Fujisawa et al.

(10) Patent No.: US 10,103,055 B2
(45) Date of Patent: Oct. 16, 2018

(54) EXPANSION SHEET, EXPANSION SHEET MANUFACTURING METHOD, AND EXPANSION SHEET EXPANDING METHOD

(71) Applicant: DISCO CORPORATION, Tokyo (JP)

(72) Inventors: Shinichi Fujisawa, Tokyo (JP); Ryoji Tanimoto, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/608,477

(22) Filed: May 30, 2017

(65) Prior Publication Data

US 2017/0352588 A1  Dec. 7, 2017

(30) Foreign Application Priority Data

Jun. 1, 2016 (JP) .................. 2016-110320

(51) Int. Cl.
*H01L 21/768* (2006.01)
*H01L 21/02* (2006.01)
*H01L 21/67* (2006.01)

(52) U.S. Cl.
CPC .... *H01L 21/76862* (2013.01); *H01L 21/0231* (2013.01); *H01L 21/02348* (2013.01); *H01L 21/67115* (2013.01); *H01L 21/67132* (2013.01); *H01L 21/76825* (2013.01); *H01L 2221/68327* (2013.01); *H01L 2221/68381* (2013.01)

(58) Field of Classification Search
CPC ........... H01L 21/76862; H01L 21/0231; H01L 21/02348; H01L 21/76825
See application file for complete search history.

(56) References Cited

U.S. PATENT DOCUMENTS

| | | | | |
|---|---|---|---|---|
| 9,612,779 | B1* | 4/2017 | Yamada | .................. G06F 3/121 |
| 2003/0108738 | A1* | 6/2003 | Alahapperuma | ...... C09J 7/0217 |
| | | | | 428/343 |
| 2008/0074453 | A1* | 3/2008 | Furukawa | .............. B41J 2/2142 |
| | | | | 347/14 |
| 2014/0038349 | A1* | 2/2014 | Kang | .................. H01L 51/0013 |
| | | | | 438/99 |
| 2016/0326403 | A1* | 11/2016 | Yoneyama | .......... H01L 21/6836 |

FOREIGN PATENT DOCUMENTS

| | | |
|---|---|---|
| JP | 2002-192370 | 7/2002 |
| JP | 2014-022382 | 2/2014 |
| WO | 03077295 A1 | 9/2003 |

* cited by examiner

*Primary Examiner* — Earl Taylor
(74) *Attorney, Agent, or Firm* — Greer Burns & Crain Ltd.

(57) ABSTRACT

An expansion sheet is adapted to be held and expanded by an expanding apparatus when a platelike workpiece is attached to the expansion sheet. The expansion sheet has a peripheral area around the workpiece where the expansion sheet is adapted to be held by first, second, third, and fourth holding units that are moveable away from each other. The expansion sheet includes a base sheet and an adhesive layer formed on the base sheet, the adhesive layer having adhesion adapted to be reduced by applying ultraviolet light. The adhesion of the adhesive layer in the peripheral area of the expansion sheet is lower than that in the other area of the expansion sheet.

2 Claims, 10 Drawing Sheets

EXPANSION SHEET, EXPANSION SHEET MANUFACTURING METHOD, AND EXPANSION SHEET EXPANDING METHOD

BACKGROUND OF THE INVENTION

Field of the Invention

The present invention relates to an expansion sheet adapted to be expanded in the condition where a platelike workpiece is attached to the expansion sheet, and also relates to a manufacturing method for the expansion sheet and an expanding method for the expansion sheet.

Description of the Related Art

As a method for dividing a platelike workpiece such as a semiconductor wafer into a plurality of chips, there has been put into practical use a processing method including the steps of focusing a laser beam inside the workpiece to thereby form a modified layer (modified region) inside the workpiece and next applying an external force to the workpiece to divide the workpiece along the modified layer (see Japanese Patent Laid-open No. 2002-192370, for example). In this processing method, an expansion sheet attached to the workpiece is expanded to thereby apply an external force to the workpiece, thus dividing the workpiece into the plural chips.

As another method, there has been proposed a processing method utilizing an external force applied to the workpiece in grinding or polishing the workpiece after forming a modified layer inside the workpiece, thereby dividing the workpiece along the modified layer into the plural chips (see PCT Patent Publication No. WO2003/77295, for example). After dividing the workpiece into the plural chips in this processing method, the expansion sheet attached to the workpiece is expanded to increase the spacing between any adjacent ones of the plural chips. In this case, it is possible to prevent damage to each chip due to the contact of the adjacent chips in handling each chip later.

In recent years, there has been put into practical use an expanding apparatus capable of expanding an expansion sheet in desired directions (see Japanese Patent Laid-open No. 2014-22382, for example). This expanding apparatus includes a first holding unit (first holding means) and a second holding unit (second holding means) opposed to each other with a workpiece interposed therebetween in a first direction substantially parallel to the expansion sheet, in the condition where the workpiece is attached to the expansion sheet. The expanding apparatus further includes a third holding unit (third holding means) and a fourth holding unit (fourth holding means) opposed to each other with the workpiece interposed therebetween in a second direction perpendicular to the first direction in a plane parallel to the expansion sheet. The first holding unit and the second holding unit are movable away from each other in the first direction, and the third holding unit and the fourth holding unit are movable away from each other in the second direction. These four holding units are operated to hold four areas of the expansion sheet. Thereafter, the first holding unit and the second holding unit are moved away from each other in the first direction, and the third holding unit and the fourth holding unit are moved away from each other in the second direction, so that the expansion sheet can be expanded both in the first direction and in the second direction.

SUMMARY OF THE INVENTION

The expansion sheet has an adhesive layer having adhesion on the upper surface (or the lower surface). Accordingly, when both sides of the expansion sheet having the adhesive layer are held by each holding unit, there is a possibility that the expansion sheet may not be removed from each holding unit later.

It is therefore an object of the present invention to provide an expansion sheet which can be easily removed from each holding unit of the expanding apparatus.

It is another object of the present invention to provide a manufacturing method for this expansion sheet.

It is a further object of the present invention to provide an expanding method for this expansion sheet.

In accordance with an aspect of the present invention, there is provided an expansion sheet adapted to be held and expanded by an expanding apparatus in the condition where a platelike workpiece is attached to the expansion sheet, the expanding apparatus including a first holding unit and a second holding unit opposed to each other with the workpiece interposed therebetween in a first direction, the first holding unit and the second holding unit being movable away from each other in the first direction, the expanding apparatus further including a third holding unit and a fourth holding unit opposed to each other with the workpiece interposed therebetween in a second direction perpendicular to the first direction, the third holding unit and the fourth holding unit being movable away from each other in the second direction, the expansion sheet having a peripheral area around the workpiece where the expansion sheet is adapted to be held by the first holding unit, the second holding unit, the third holding unit, and the fourth holding unit; the expansion sheet including a base sheet; and an adhesive layer formed on the base sheet, the adhesive layer having adhesion adapted to be reduced by applying ultraviolet light; the adhesion of the adhesive layer in the peripheral area of the expansion sheet being lower than the adhesion of the adhesive layer in the other area of the expansion sheet.

The expansion sheet may be elongated and formed as a sheet roll. In this case, the expansion sheet as the sheet roll is rolled in the first direction, and the peripheral area of the expansion sheet includes a plurality of first low adhesion areas arranged at given intervals in the first direction, each first low adhesion area extending in the second direction over the entire width of the base sheet, and a pair of second low adhesion areas extending in the first direction along the opposite side edges of the base sheet.

In accordance with another aspect of the present invention, there is provided a manufacturing method for an expansion sheet adapted to be held and expanded by an expanding apparatus in the condition where a platelike workpiece is attached to the expansion sheet, the expanding apparatus including a first holding unit and a second holding unit opposed to each other with the workpiece interposed therebetween in a first direction, the first holding unit and the second holding unit being movable away from each other in the first direction, the expanding apparatus further including a third holding unit and a fourth holding unit opposed to each other with the workpiece interposed therebetween in a second direction perpendicular to the first direction, the third holding unit and the fourth holding unit being movable away from each other in the second direction, the expansion sheet having a peripheral area around the workpiece where the expansion sheet is adapted to be held by the first holding unit, the second holding unit, the third holding unit, and the fourth holding unit; the manufacturing method including a preparing step of preparing an original expansion sheet including a base sheet and an adhesive layer formed on the base sheet, the adhesive layer having adhesion adapted to be reduced by applying ultraviolet light; and an ultraviolet light applying step of selectively applying ultraviolet light to only a peripheral area of the original expansion sheet corresponding to the peripheral area of the expansion sheet, thereby reducing the adhesion of the adhesive layer in the peripheral area of the original expansion sheet as compared with the adhesion of the adhesive layer in the other area of the original expansion sheet.

In accordance with a further aspect of the present invention, there is provided an expanding method for an expansion sheet including a base sheet and an adhesive layer formed on the base sheet, the adhesive layer having adhesion adapted to be reduced by applying ultraviolet light, the expanding method including a first attaching step of attaching a platelike workpiece to the expansion sheet; a holding step of holding the expansion sheet by using a first holding unit and a second holding unit opposed to each other with the workpiece interposed therebetween in a first direction and also by using a third holding unit and a fourth holding unit opposed to each other with the workpiece interposed therebetween in a second direction perpendicular to the first direction, before or after performing the first attaching step; an expanding step of moving the first holding unit and the second holding unit away from each other in the first direction and also moving the third holding unit and the fourth holding unit away from each other in the second direction, after performing the first attaching step and the holding step, thereby expanding the expansion sheet both in the first direction and in the second direction; a second attaching step of attaching an annular frame having an inside opening greater in size than the workpiece, to the expansion sheet in the condition where the workpiece is set in the inside opening of the annular frame, after performing the expanding step; a cutting step of cutting the expansion sheet along the annular frame after performing the second attaching step; and an ultraviolet light applying step of selectively applying ultraviolet light to only a peripheral area of the expansion sheet where the expansion sheet is adapted to be held by the first holding unit, the second holding unit, the third holding unit, and the fourth holding unit, before performing the holding step, thereby reducing the adhesion of the adhesive layer in the peripheral area of the expansion sheet as compared with the adhesion of the adhesive layer in the other area of the expansion sheet.

In the expansion sheet according to the present invention, the adhesion of the adhesive layer in the peripheral area to be held by the first holding unit, the second holding unit, the third holding unit, and the fourth holding unit is lower than that in the other area of the expansion sheet. Accordingly, the expansion sheet can be easily removed from each holding unit.

In the manufacturing method for the expansion sheet according to the present invention, ultraviolet light is selectively applied to the adhesive layer in only the peripheral area of the original expansion sheet corresponding to the peripheral area of the expansion sheet as a product, thereby reducing the adhesion of the adhesive layer in the peripheral area of the original expansion sheet as compared with the adhesion of the adhesive layer in the other area of the original expansion sheet. Accordingly, the expansion sheet described above can be simply manufactured.

In the expanding method for the expansion sheet according to the present invention, ultraviolet light is selectively applied to the adhesive layer in only the peripheral area of the expansion sheet before holding the expansion sheet in this peripheral area by using the first, second, third, and fourth holding units, thereby reducing the adhesion of the adhesive layer in this peripheral area as compared with the adhesion of the adhesive layer in the other area. Accordingly, the expansion sheet can be easily removed from each holding unit after expanding the expansion sheet.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
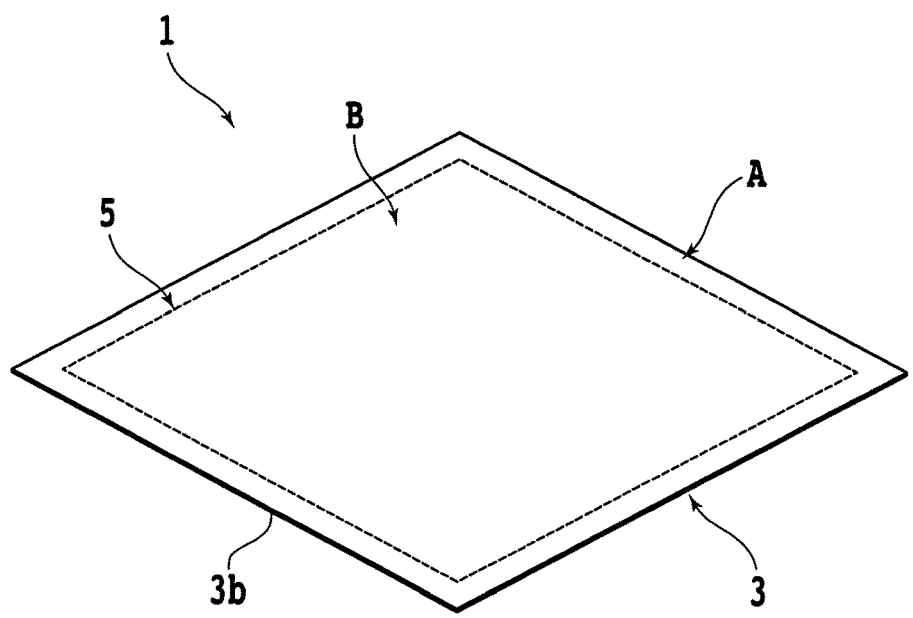
FIG. 1A is a schematic perspective view of an expansion sheet according to a preferred embodiment of the present invention.
Figure 1B:
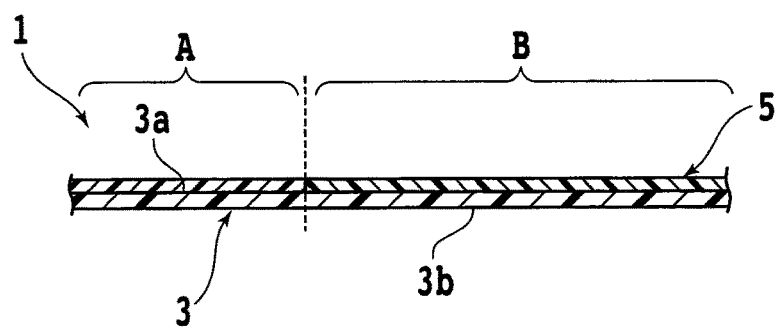
FIG. 1B is a schematic sectional view of the expansion sheet.

A preferred embodiment of the expansion sheet according to the present invention will now be described with reference to the attached drawings. FIG. 1A is a schematic perspective view of an expansion sheet 1 according to this preferred embodiment, and FIG. 1B is a schematic sectional view of the expansion sheet 1 shown in FIG. 1A. As shown in FIGS. 1A and 1B, the expansion sheet 1 includes a base sheet 3 having a first surface (upper surface) 3$a$ and a second surface (lower surface) 3$b$. An adhesive layer 5 is formed on the first surface 3$a$ of the base sheet 3. The base sheet 3 is formed of resin such as polyolefin and polyvinyl chloride. The base sheet 3 is rectangular in plan. However, the shape, material, etc. of the base sheet 3 are not limited, provided that the base sheet 3 can be properly expanded by using an expanding apparatus to be hereinafter described. The adhesive layer 5 is formed of ultraviolet curing resin curable by ultraviolet light, wherein the adhesion of the adhesive layer 5 of the expansion sheet 1 in a peripheral area to be held by the expanding apparatus is set lower than that in the other area. Examples of the ultraviolet curing resin include acrylic resin and rubber resin. In other words, the peripheral area of the expansion sheet 1 to be held by the expanding apparatus is defined as a low adhesion area A where the adhesion of the adhesive layer 5 is relatively low. In contrast, the other area of the expansion sheet 1 is a central area surrounded by the low adhesion area A, and this central area is defined as a high adhesion area B where the adhesion of the adhesive layer 5 is relatively high. By applying ultraviolet light to the ultraviolet curing resin forming the adhesive layer 5, the ultraviolet curing resin is cured or semicured and thereby reduced in adhesion. Accordingly, by utilizing this phenomenon, it is possible to manufacture the expansion sheet 1 having the low adhesion area A and the high adhesion area B. The adhesion of the adhesive layer 5 in the low adhesion area A may be completely lost. That is, the low adhesion area A of the adhesive layer 5 may have no adhesion.

Figure 2A:
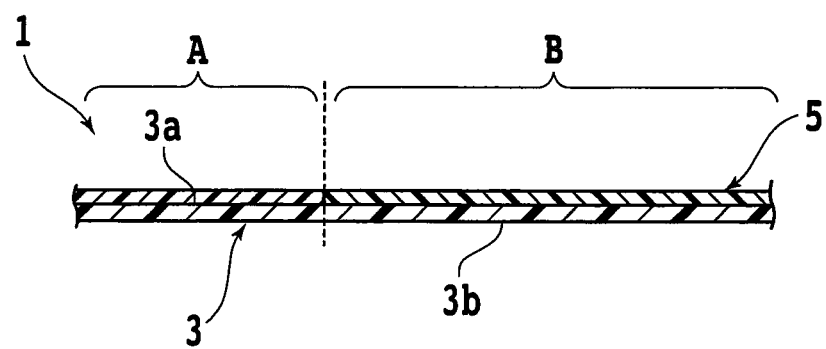
FIGS. 2A and 2B are schematic sectional views showing a manufacturing method for the expansion sheet.
Figure 2B:
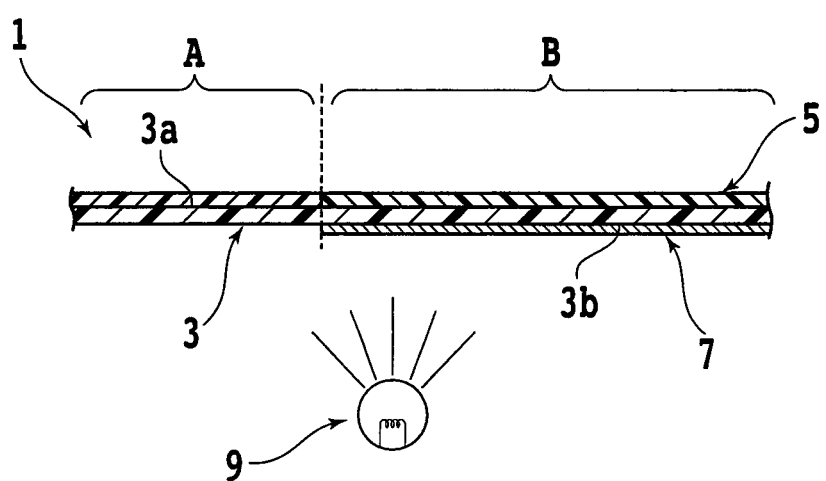

FIGS. 2A and 2B are schematic sectional views showing a manufacturing method for the expansion sheet 1. In manufacturing the expansion sheet 1 according to this preferred embodiment, a preparing step is first performed to prepare an original expansion sheet having the base sheet 3 and the adhesive layer 5 formed on the first surface 3a of the base sheet 3 as shown in FIG. 2A. This original expansion sheet is an expansion sheet to be processed by ultraviolet light. In this stage, the adhesion of the adhesive layer 5 is substantially uniform over the entire area of the original expansion sheet.

After performing the preparing step, an ultraviolet light applying step is performed to selectively apply ultraviolet light to only a peripheral area of the adhesive layer 5 corresponding to the low adhesion area A as shown in FIG. 2B. In the ultraviolet light applying step, a mask 7 for blocking ultraviolet light is set so as to cover a central area of the adhesive layer 5 corresponding to the high adhesion area B as shown in FIG. 2B. In this preferred embodiment, the mask 7 is set on the second surface (lower surface) 3b of the base sheet 3 in the central area corresponding to the high adhesion area B as shown in FIG. 2B. Accordingly, in removing the mask 7 later, the mask 7 can be easily removed without adhesion to the adhesive layer 5. After setting the mask 7 as mentioned above, ultraviolet light is applied from a light source 9 through the base sheet 3 to the adhesive layer 5. The light source 9 is located below the second surface 3b of the base sheet 3. As mentioned above, the mask 7 is set so as to cover the central area of the adhesive layer 5 corresponding to the high adhesion area B. Further, the base sheet 3 can transmit ultraviolet light in this preferred embodiment. Accordingly, the ultraviolet light emitted from the light source 9 is selectively applied to only the peripheral area of the adhesive layer 5 corresponding to the low adhesion area A (the area not covered with the mask 7). As a result, the adhesive layer 5 in the peripheral area is cured or semicured by the ultraviolet light applied from the light source 9. Thereafter, the mask 7 is removed from the base sheet 3. In this manner, the expansion sheet 1 is manufactured as shown in FIG. 2B, wherein the expansion sheet 1 has the low adhesion area A where the adhesion of the adhesive layer 5 has been reduced and the high adhesion area B where the adhesion of the adhesive layer 5 has not been reduced. In the case that the base sheet 3 does not transmit ultraviolet light, the mask 7 may be set on the adhesive layer 5 in its central area, and the light source 9 may be located above the adhesive layer 5. Accordingly, ultraviolet light is directly applied from the light source 9 to the adhesive layer 5. In this case, the surface of the mask 7 may be preferably treated with fluororesin, so as to prevent adhesion to the adhesive layer 5.

There will now be described an expansion sheet expanding method including the above-mentioned manufacturing method for the expansion sheet 1 as a part of the expanding method. First, the preparing step and the ultraviolet light applying step of the above-mentioned manufacturing method for the expansion sheet 1 are performed to thereby obtain the expansion sheet 1 having the low adhesion area A to be held by an expanding apparatus and the high adhesion area B surrounded by the low adhesion area A, wherein the adhesion of the adhesive layer 5 in the low adhesion area A is lower than that in the high adhesion area B.

Figure 3:
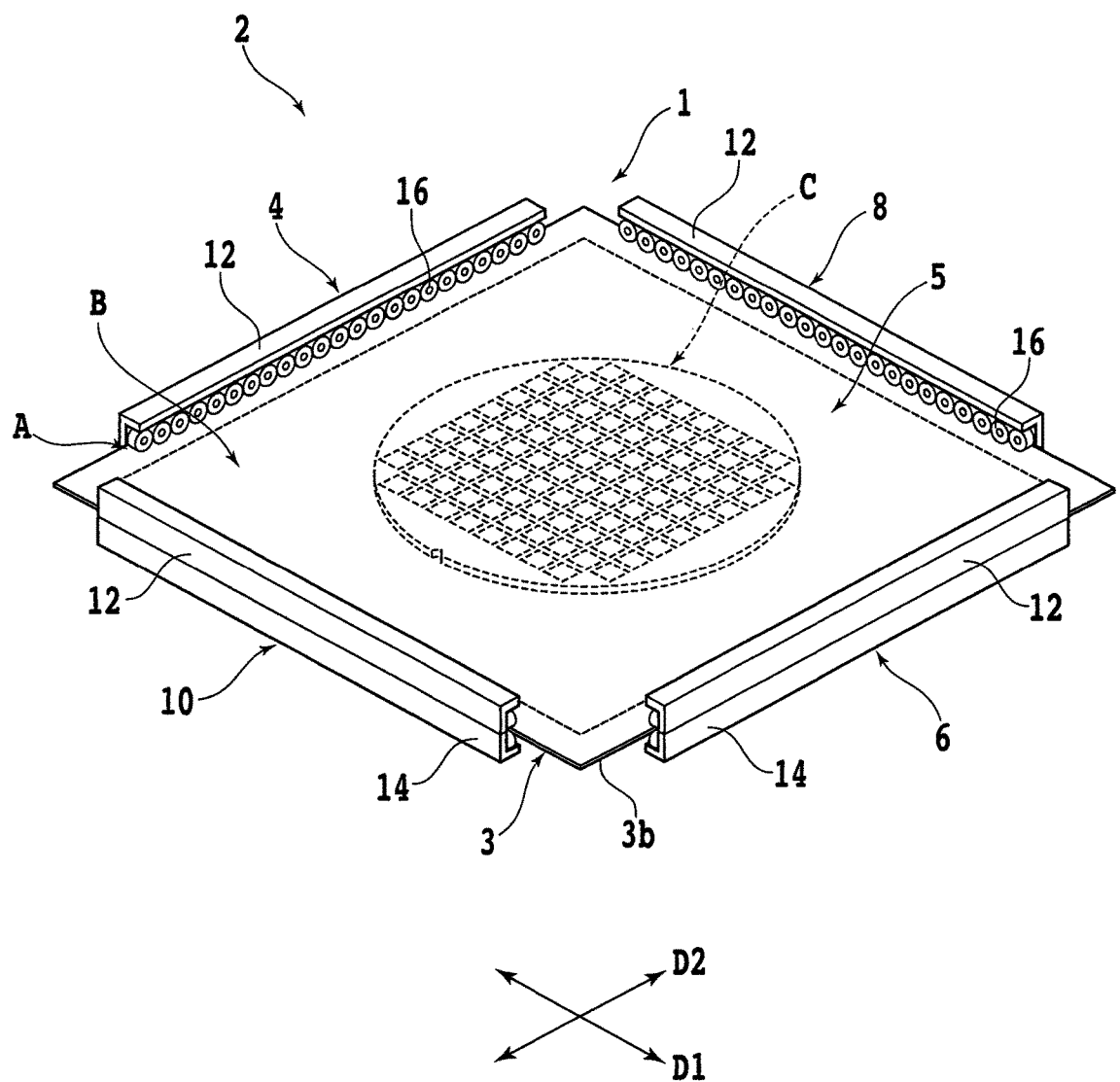
FIG. 3 is a schematic perspective view showing the condition where the expansion sheet has been held by an expanding apparatus.

After performing the ultraviolet light applying step, a holding step is performed to hold the expansion sheet 1 by using an expanding apparatus 2 as shown in FIG. 3. FIG. 3 is a schematic perspective view showing the condition where the expansion sheet 1 has been held by the expanding apparatus 2. In FIG. 3, there is also shown a circular area C where a platelike workpiece 11 (see FIG. 4) is to be attached later. As shown in FIG. 3, the expanding apparatus 2 includes a first holding unit (first holding means) 4 and a second holding unit (second holding means) 6 opposed to each other with the area C, i.e., the workpiece 11 interposed therebetween in a first direction D1 substantially parallel to the expansion sheet 1. Similarly, the expanding apparatus 2 further includes a third holding unit (third holding means) 8 and a fourth holding unit (fourth holding means) 10 opposed to each other with the area C interposed therebetween in a second direction D2 substantially parallel to the expansion sheet 1 and perpendicular to the first direction D1. The first holding unit 4 and the second holding unit 6 are supported by respective horizontal moving mechanisms (not shown) so as to be movable away from each other in the first direction D1. Similarly, the third holding unit 8 and the fourth holding unit 10 are supported by respective horizontal moving mechanisms (not shown) so as to be movable away from each other in the second direction D2.

Each of the first holding unit 4, the second holding unit 6, the third holding unit 8, and the fourth holding unit 10 includes an upper support member 12 adapted to be set above the expansion sheet 1 (above the adhesive layer 5) and a lower support member 14 adapted to be set below the expansion sheet 1 (below the second surface 3b of the base sheet 3). Each of the upper support member 12 and the lower support member 14 is a bar-like member extending in a predetermined direction and having a length greater than the diameter of the circular area C. More specifically, the upper support member 12 and the lower support member 14 included in each of the first and second holding units 4 and 6 extend in the second direction D2, whereas the upper support member 12 and the lower support member 14 included in each of the third and fourth holding units 8 and 10 extend in the first direction D1. A plurality of contact members 16 are mounted to each upper support member 12 on the lower side thereof. Similarly, a plurality of contact members 16 are mounted to each lower support member 14 on the upper side thereof. Each contact member 16 is a cylindrical member, which is rotatable around its axis in the condition where it is kept in contact with the expansion sheet 1. The rotation axes of the plural contact members 16 included in each of the first and second holding units 4 and 6 are set parallel to the first direction D1, whereas the rotation axes of the plural contact members 16 included in each of the third and fourth holding units 8 and 10 are set parallel to the second direction D2.

In holding the expansion sheet 1 by using the holding units 4, 6, 8, and 10, the low adhesion area A of the expansion sheet 1 is held (sandwiched) between the upper support member 12 and the lower support member 14 of each holding unit as shown in FIG. 3. In other words, the low adhesion area A surrounding the high adhesion area B of the expansion sheet 1 is held by the first holding unit 4, the second holding unit 6, the third holding unit 8, and the fourth holding unit 10 in such a manner that the plural contact members 16 of each holding unit come into contact with the low adhesion area A of the expansion sheet 1.

Figure 4:
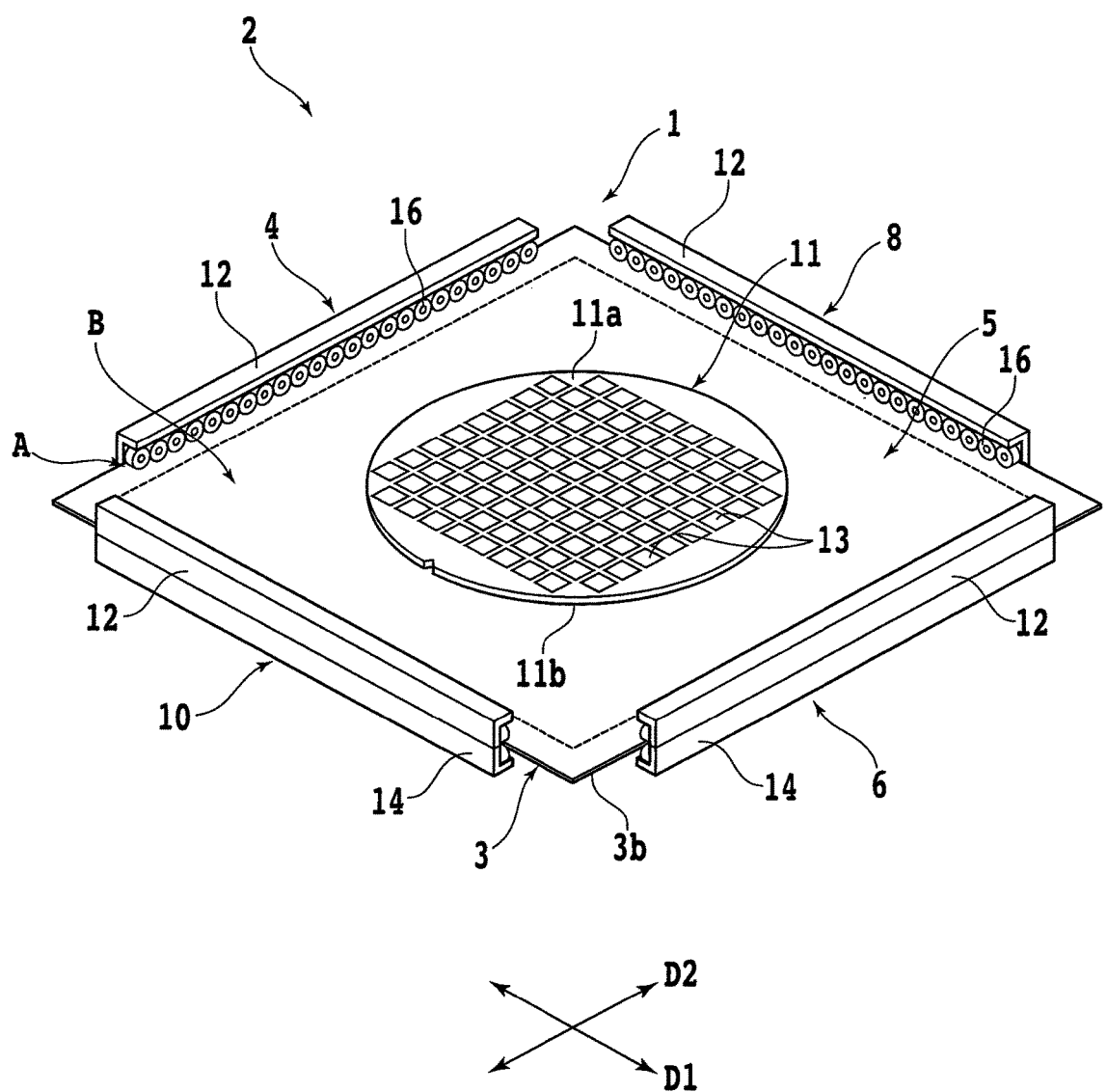
FIG. 4 is a schematic perspective view showing the condition where a workpiece has been attached to the expansion sheet.

After performing the holding step, a first attaching step is performed to attach the platelike workpiece 11 to the expansion sheet 1 as shown in FIG. 4.

FIG. 4 is a schematic perspective view showing the condition where the workpiece 11 has been attached to the expansion sheet 1. In this preferred embodiment, the workpiece 11 is a circular wafer formed of a semiconductor such as silicon. The workpiece 11 has a first surface (front side) 11a and a second surface (back side) 11b. The first surface 11a of the workpiece 11 is composed of a central device area and a peripheral marginal area surrounding the device area. The device area is partitioned by a plurality of crossing division lines (streets) to define a plurality of separate regions where a plurality of devices 13 such as integrated circuits (ICs) and large-scale integrations (LSIs) are formed. A modified layer (not shown) as a division start point is previously formed inside the workpiece 11 along each division line. This modified layer may be formed by a method of applying a laser beam having a transmission wavelength to the workpiece 11 along each division line so as to focus the laser beam inside the workpiece 11. As a modification, a groove may be formed on the workpiece 11 along each division line by cutting or laser ablation. In this case, the groove formed along each division line is used as a division start point in place of the modified layer.

In this preferred embodiment, the second surface 11b of the workpiece 11 is attached to the adhesive layer 5 of the expansion sheet 1 in the circular area C (see FIG. 3), wherein the circular area C has the same size as that of the workpiece 11. The circular area C is defined in the high adhesion area B of the expansion sheet 1. While a circular wafer formed of a semiconductor such as silicon is used as the workpiece 11 in this preferred embodiment, the workpiece 11 is not limited in its material, shape, structure, etc. For example, a substrate formed of ceramic, resin, or metal may be used as the workpiece 11. Further, a wafer or substrate previously divided into a plurality of chips may be used as the workpiece 11. In this case, the spacing between any adjacent ones of the plural chips forming the workpiece 11 is increased by expanding the expansion sheet 1 in a subsequent step.

Figure 5:
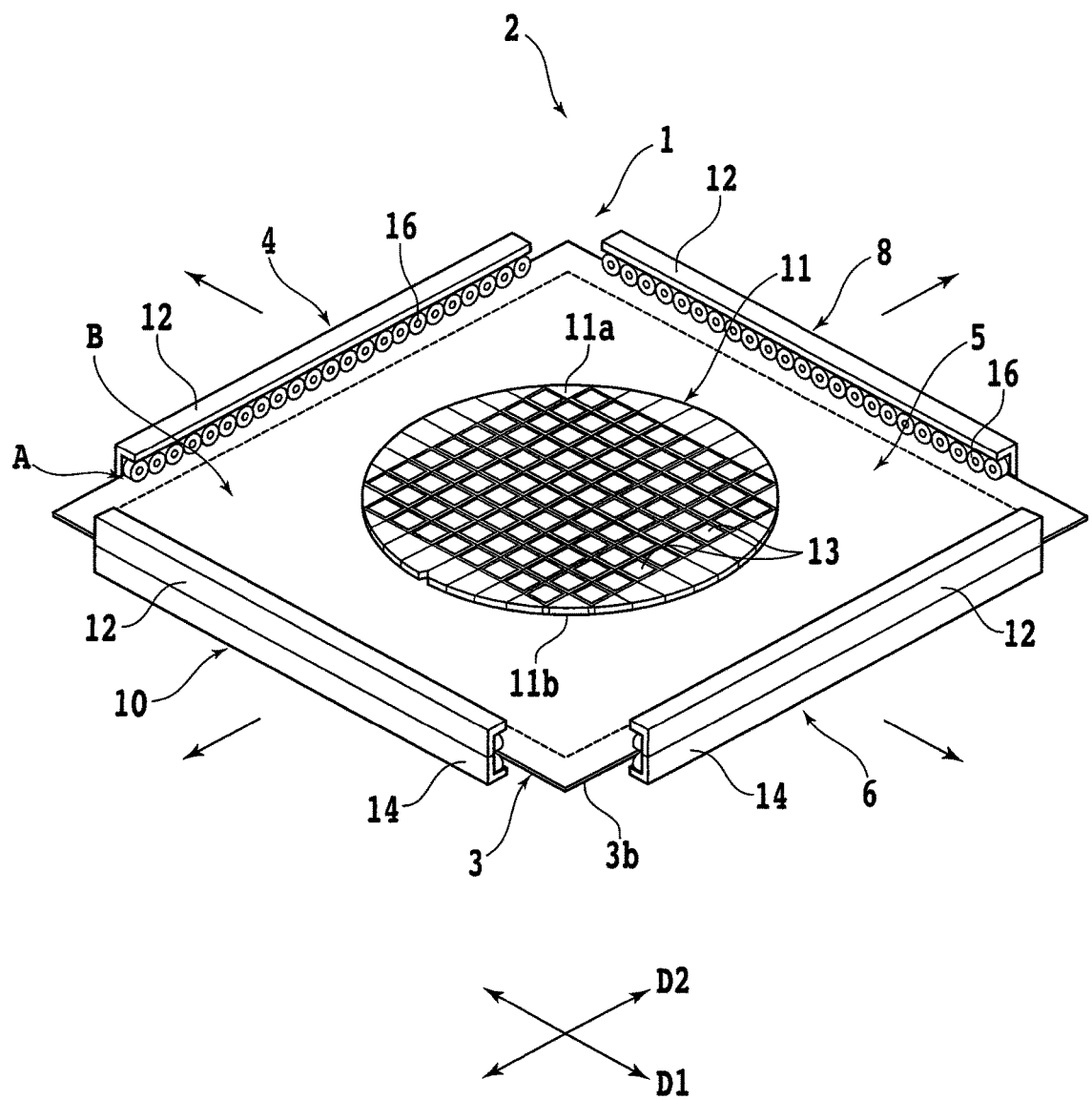
FIG. 5 is a schematic perspective view showing the condition where the expansion sheet has been expanded by the expanding apparatus.

After performing the first attaching step, an expanding step is performed to expand the expansion sheet 1 as shown in FIG. 5. FIG. 5 is a schematic perspective view showing the condition where the expansion sheet 1 has been expanded by the expanding apparatus 2. In expanding the expansion sheet 1, the horizontal moving mechanisms for movably supporting the first holding unit 4 and the second holding unit 6 are operated to move the first holding unit 4 and the second holding unit 6 away from each other in the first direction D1. Furthermore, the horizontal moving mechanisms for movably supporting the third holding unit 8 and the fourth holding unit 10 are operated to move the third holding unit 8 and the fourth holding unit 10 away from each other in the second direction D2. As a result, the expansion sheet 1 is expanded both in the first direction D1 and in the second direction D2 as shown in FIG. 5, thereby applying a tensile force to the workpiece 11 both in the first direction D1 and in the second direction D2.

Each of the first and second holding units 4 and 6 movable away from each other in the first direction D1 includes the plural contact members 16 each rotatable around an axis parallel to the first direction D1. Similarly, each of the third and fourth holding units 8 and 10 movable away from each other in the second direction D2 includes the plural contact members 16 each rotatable around an axis parallel to the second direction D2. Accordingly, the expansion sheet 1 is held by the first and second holding units 4 and 6 so as to be displaceable in the second direction D2 by the rotation of the contact members 16 of the third and fourth holding units 8 and 10. Similarly, the expansion sheet 1 is held by the third and fourth holding units 8 and 10 so as to be displaceable in the first direction D1 by the rotation of the contact members 16 of the first and second holding units 4 and 6. In other words, the area A held by the first and second holding units 4 and 6 can also be properly expanded in the second direction D2, and the area A held by the third and fourth holding units 8 and 10 can also be properly expanded in the first direction D1.

In this manner, the expansion sheet 1 is expanded to thereby apply a tensile force to the workpiece 11 both in the first direction D1 and in the second direction D2. As a result, the workpiece 11 is divided along each division line where the modified layer is formed, thereby obtaining a plurality of chips and also increasing the spacing between any adjacent ones of the plural chips. To properly divide the workpiece 11 and sufficiently increase the spacing between the adjacent chips, the directions of extension of the orthogonal division lines are preferably made to coincide with the first and second directions D1 and D2 as shown in FIG. 5, thereby efficiently utilizing the external force generated by the expansion of the expansion sheet 1.

Figure 6:
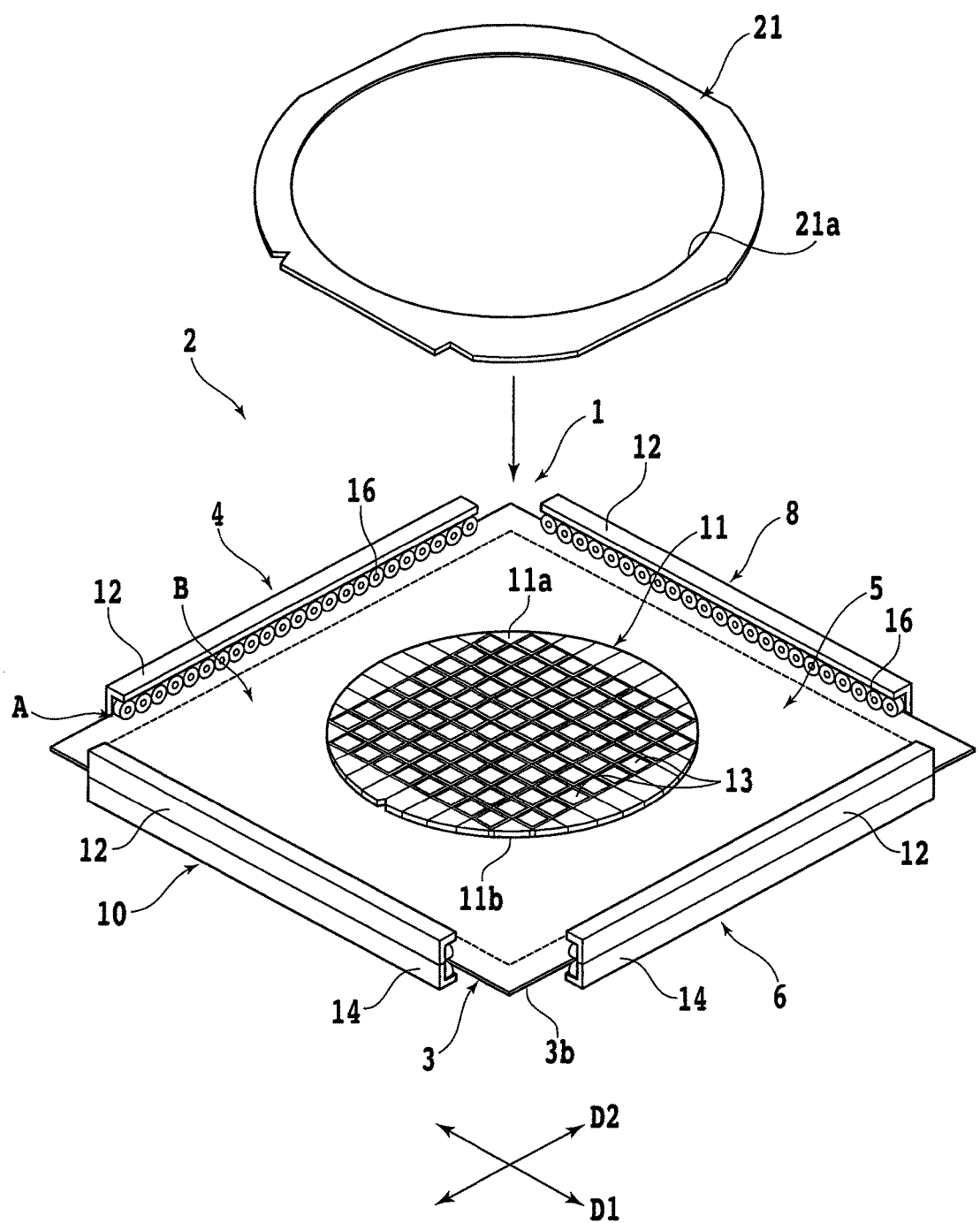
FIG. 6 is a schematic perspective view showing the condition where an annular frame is being attached to the expansion sheet.

After performing the expanding step, a second attaching step is performed to attach an annular frame 21 to the expansion sheet 1 as shown in FIG. 6. FIG. 6 is a schematic perspective view showing the condition where the annular frame 21 is being attached to the expansion sheet 1. As shown in FIG. 6, the annular frame 21 has an inside opening 21a greater in size than the workpiece 11. The annular frame 21 is attached to the adhesive layer 5 of the expansion sheet 1 so as to surround the workpiece 11, i.e., the circular area C of the expansion sheet 1. In other words, the workpiece 11 attached to the circular area C of the expansion sheet 1 is set in the inside opening 21a of the annular frame 21. In this manner, the annular frame 21 is attached to the expansion sheet 1 so as to surround the workpiece 11. In this preferred embodiment, the annular frame 21 is attached to the expansion sheet 1 so as to surround the workpiece 11 in the condition where the expansion sheet 1 is kept expanded. Accordingly, even after the expansion of the expansion sheet 1 is canceled, the increased spacing between the adjacent chips can be maintained.

Figure 7:
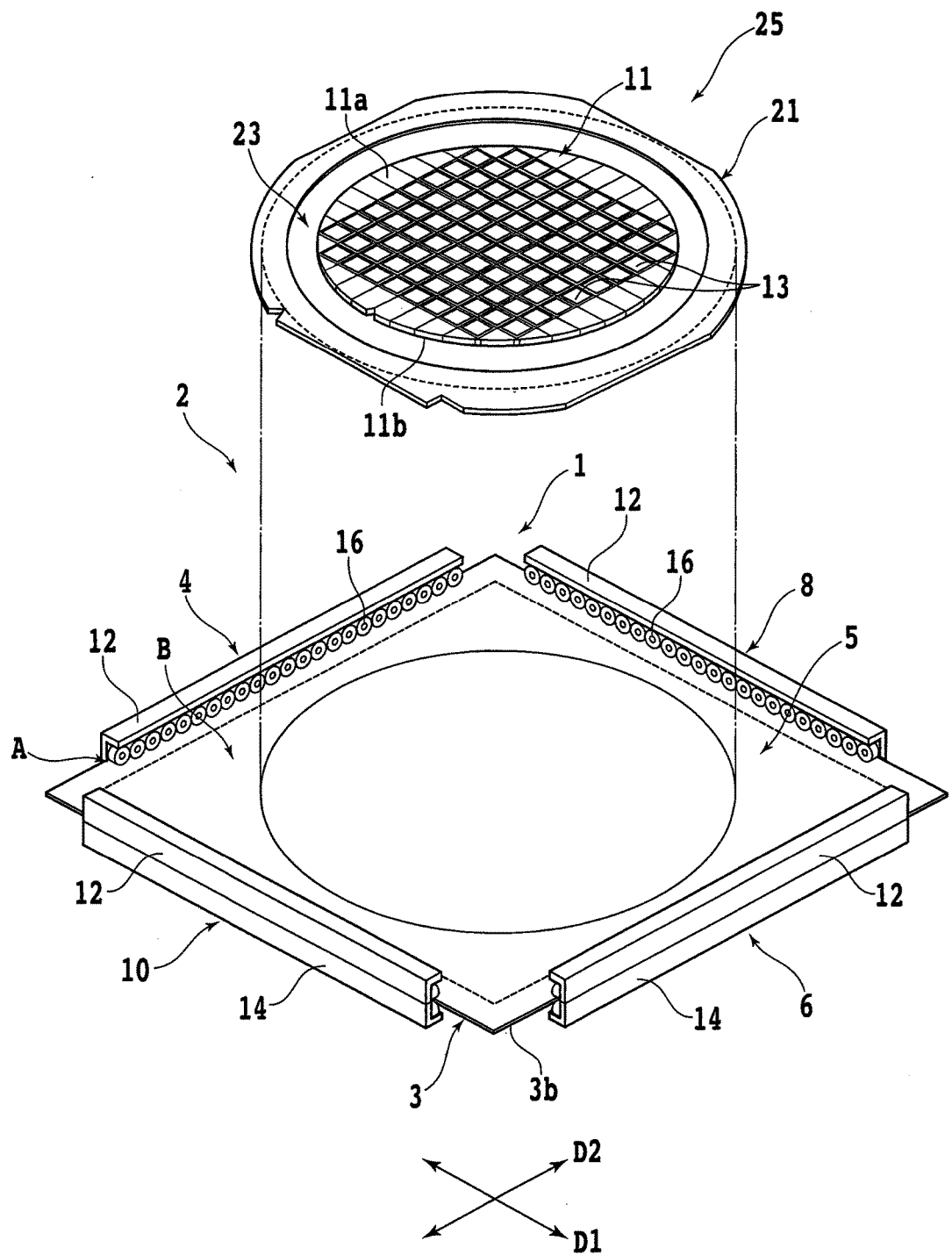
FIG. 7 is a schematic perspective view showing the condition where the expansion sheet has been cut along the annular frame.

After performing the second attaching step, a cutting step is performed to cut the expansion sheet 1 along the annular frame 21 as shown in FIG. 7. FIG. 7 is a schematic perspective view showing the condition where the expansion sheet 1 has been cut along the annular frame 21. For example, the expansion sheet 1 is cut along the annular frame 21 from the second surface 3b of the base sheet 3 at a radial position between the inner circumference of the annular frame 21 and the outer circumference thereof. By performing this cutting step, a frame unit 25 can be obtained as shown in FIG. 7, wherein the frame unit 25 is composed of the workpiece 11 already divided into the chips, the annular frame 21, and an expansion sheet portion 23 cut from the expansion sheet 1. After obtaining the frame unit 25, the expansion sheet 1 remaining is removed from the expanding apparatus 2. At this time, the expansion sheet 1 remaining can be easily removed from the expanding apparatus 2 because the low adhesion area A of the expansion sheet 1 is held by the holding units 4, 6, 8, and 10 of the expanding apparatus 2, wherein the adhesion of the adhesive layer 5 in the low adhesion area A is lower than that in the high adhesion area B where the workpiece 11 and the annular frame 21 are attached.

Figure 8:
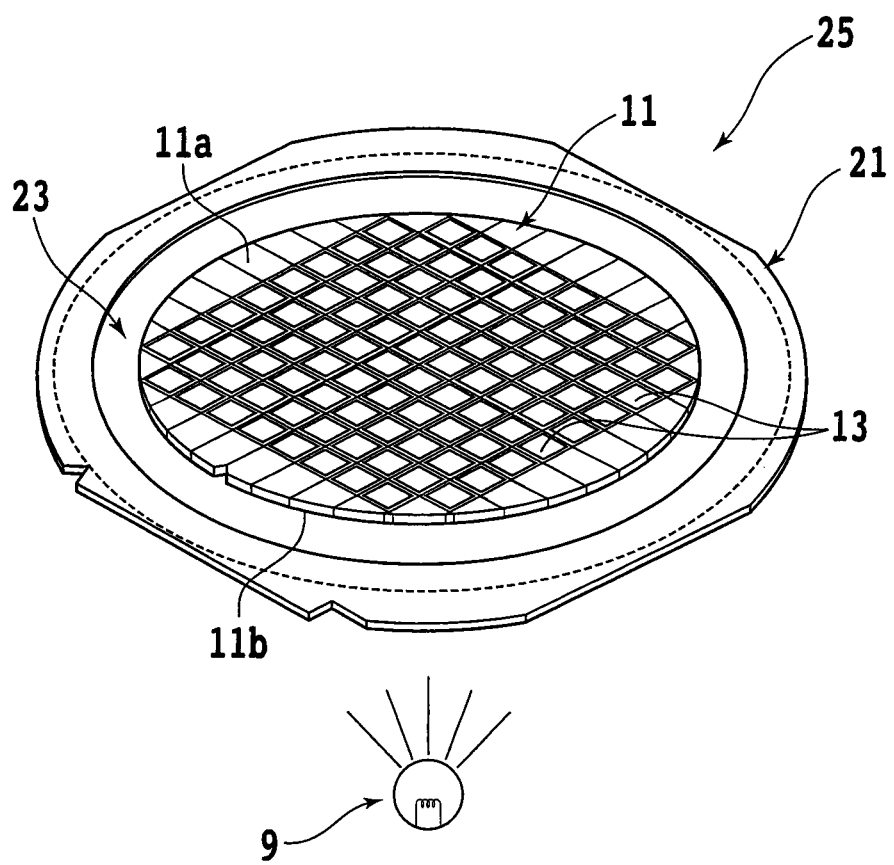
FIG. 8 is a schematic perspective view showing the condition where ultraviolet light is applied to the expansion sheet portion.

After performing the cutting step, an adhesion reducing step is performed to apply ultraviolet light to the expansion sheet portion 23 of the frame unit 25, thereby reducing the adhesion of the adhesive layer 5 of the expansion sheet portion 23 as shown in FIG. 8. FIG. 8 is a schematic perspective view showing the condition where ultraviolet light is applied to the expansion sheet portion 23. In this preferred embodiment, ultraviolet light is applied from the light source 9 located below the base sheet 3 (the second surface 3b) of the expansion sheet portion 23 as shown in FIG. 8. As mentioned above, the base sheet 3 of the expansion sheet 1, i.e., the expansion sheet portion 23, can transmit ultraviolet light. Accordingly, the ultraviolet light emitted from the light source 9 is applied through the base sheet 3 to the adhesive layer 5 of the expansion sheet portion 23. As a result, the adhesion of the adhesive layer 5 of the expansion sheet portion 23 over its entire area can be reduced to thereby facilitate the removal of the chips from the expansion sheet portion 23 as described later.

Figure 9:
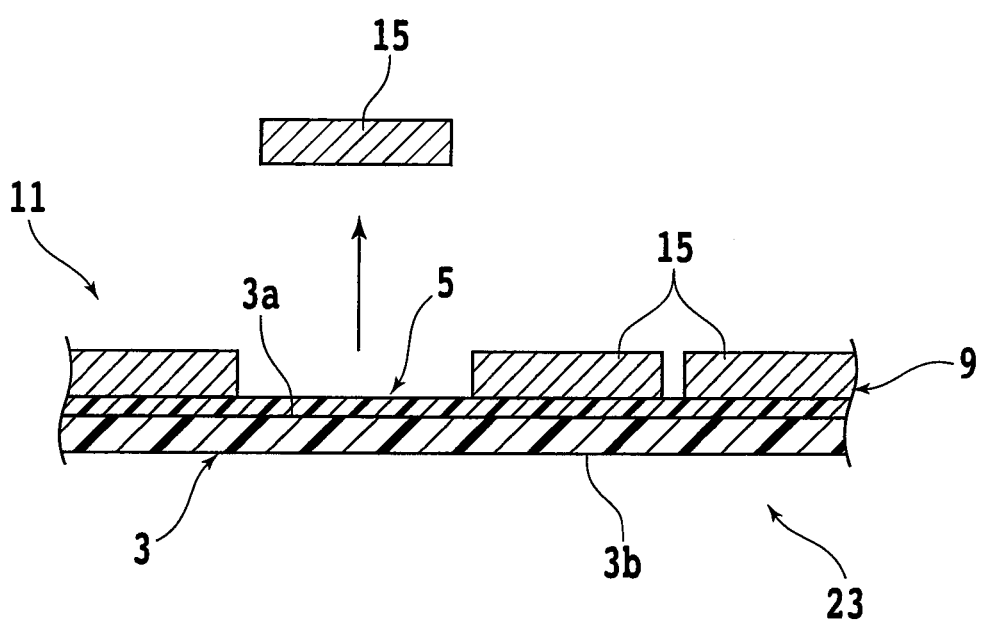
FIG. 9 is a schematic sectional view showing the condition where each chip is picked up from the expansion sheet portion.

After performing the adhesion reducing step, a pickup step is performed to pick up each chip from the expansion sheet portion 23 as shown in FIG. 9. FIG. 9 is a schematic sectional view showing the condition where each chip 15 is picked up from the expansion sheet portion 23. The adhesion of the adhesive layer 5 of the expansion sheet portion 23 has been reduced in the adhesion reducing step mentioned above. Accordingly, each chip 15 can be easily picked up from the expansion sheet portion 23 as shown in FIG. 9. Thereafter, each chip 15 picked up from the expansion sheet portion 23 is mounted on an arbitrary circuit board or the like for actual use.

As described above, the expansion sheet 1 according to this preferred embodiment has a peripheral area (low adhesion area A) to be held by the first holding unit (first holding means) 4, the second holding unit (second holding means) 6, the third holding unit (third holding means) 8, and the fourth holding unit (fourth holding means) 10, wherein the adhesion of the adhesive layer 5 in this peripheral area is lower than that in the other area (high adhesion area B). Accordingly, the expansion sheet 1 can be easily removed from each holding unit.

Further, in the manufacturing method for the expansion sheet 1, ultraviolet light is selectively applied to the adhesive layer 5 in only a peripheral area of the original expansion sheet corresponding to the low adhesion area A of the expansion sheet 1, thereby reducing the adhesion of the adhesive layer 5 in this peripheral area as compared with the adhesion of the adhesive layer 5 in the other area corresponding to the high adhesion area B of the expansion sheet 1. Thus, the expansion sheet 1 having the low adhesion area A and the high adhesion area B can be simply manufactured.

Further, in the expanding method for the expansion sheet 1, ultraviolet light is selectively applied to the adhesive layer 5 in only a peripheral area of the original expansion sheet corresponding to the low adhesion area A of the expansion sheet 1, thereby reducing the adhesion of the adhesive layer 5 in this peripheral area as compared with the adhesion of the adhesive layer 5 in the other area corresponding to the high adhesion area B of the expansion sheet 1.

Accordingly, the expansion sheet 1 can be easily removed from each holding unit after expanding the expansion sheet 1.

The present invention is not limited to the above preferred embodiment, but various modifications may be made. For example, while the first attaching step is performed after the holding step in the expansion sheet expanding method according to the above preferred embodiment, the holding step may be performed after the first attaching step. In this case, the ultraviolet light applying step may be performed between the first attaching step and the holding step.

Figure 10:
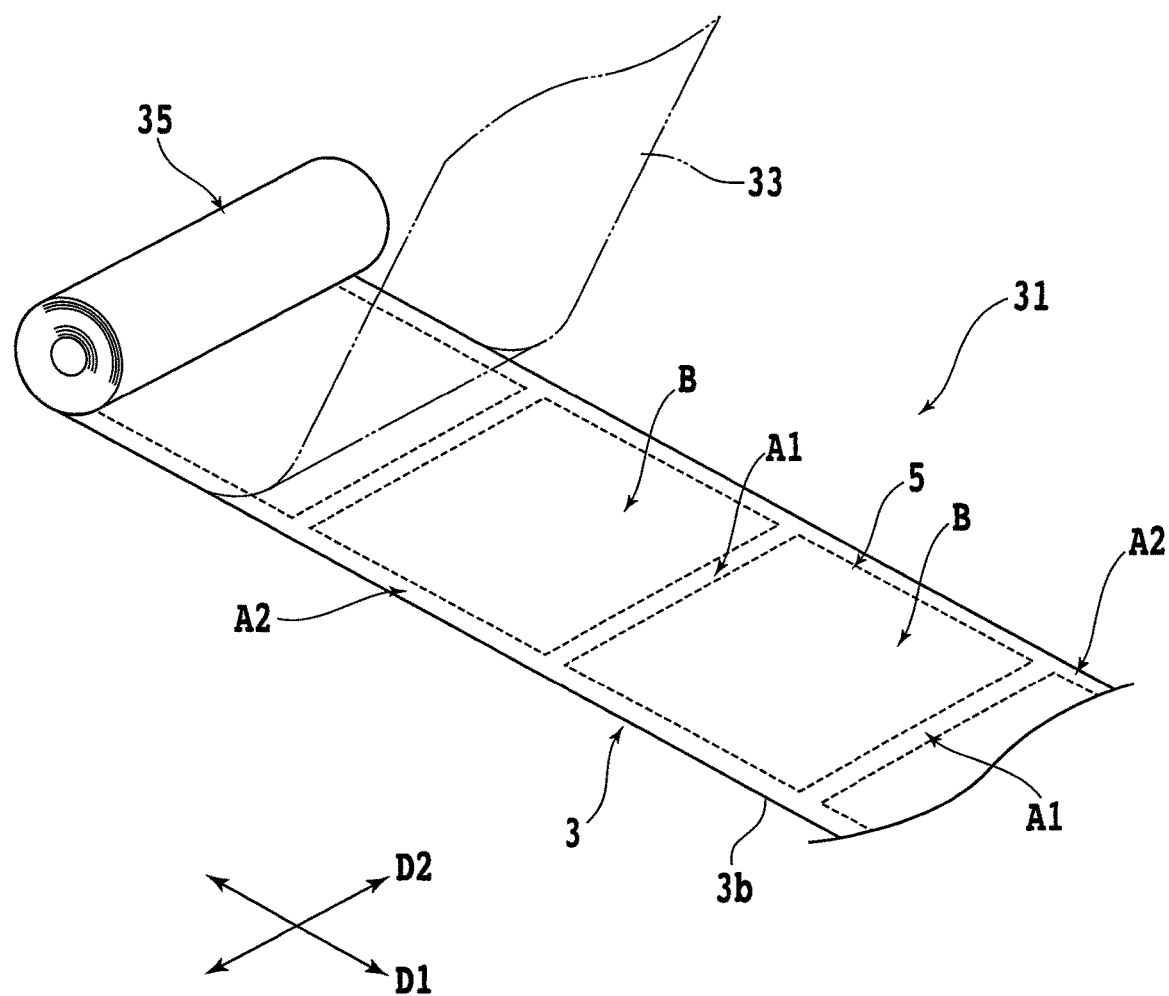
FIG. 10 is a schematic perspective view of an expansion sheet according to a modification of this preferred embodiment.

Further, while the base sheet 3 of the expansion sheet 1 according to the above preferred embodiment has a rectangular shape as viewed in plan, the shape of the base sheet of the expansion sheet according to the present invention is not limited. FIG. 10 is a schematic perspective view showing an expansion sheet 31 according to a modification of the above preferred embodiment. As shown in FIG. 10, the expansion sheet 31 according to this modification is formed as a sheet roll 35 in the condition where a separator film 33 such as a sheet of separate paper is attached to the adhesive side of the expansion sheet 31. The basic configuration of the expansion sheet 31 is the same as that of the expansion sheet 1 mentioned above. Accordingly, substantially the same parts as those of the expansion sheet 1 are denoted by the same reference symbols, and the detailed description thereof will be omitted.

The expansion sheet 31 includes an elongated base sheet 3 and an adhesive layer 5 formed on the first surface 3a of the base sheet 3 in its entire area. More specifically, the base sheet 3 of the expansion sheet 31 is longer than the base sheet 3 of the expansion sheet 1 in the first direction D1 along which the expansion sheet 31 is rolled. In contrast, the width of the base sheet 3 of the expansion sheet 31 in the second direction D2 may be the same as the length of the base sheet 3 of the expansion sheet 1 in the second direction D2. The adhesion of the adhesive layer 5 of the expansion sheet 31 in a predetermined area to be held by the expanding apparatus 2 is set lower than that in the other area. More specifically, a plurality of first low adhesion areas A1 are arranged at given intervals in the first direction D1, wherein each first low adhesion area A1 extends in the second direction D2 over the entire width of the base sheet 3. Further, a pair of second low adhesion areas A2 extend in the first direction D1 along the opposite side edges of the base sheet 3. Accordingly, a plurality of rectangular high adhesion areas B are formed so as to be surrounded by the first low adhesion areas A1 and the second low adhesion areas A2. The adhesion of the adhesive layer 5 in the first and second low adhesion areas A1 and A2 is set lower than that in the high adhesion areas B. In using the expansion sheet 31, the sheet roll 35 is unrolled to spread the expansion sheet 31, and the separator film 33 is next peeled from the expansion sheet 31.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An expansion sheet adapted to be held and expanded by an expanding apparatus in the condition where a platelike workpiece is attached to said expansion sheet, said expanding apparatus including a first holding unit and a second holding unit opposed to each other with said workpiece interposed therebetween in a first direction, said first holding unit and said second holding unit being movable away from each other in said first direction, said expanding apparatus further including a third holding unit and a fourth holding unit opposed to each other with said workpiece interposed therebetween in a second direction perpendicular to said first direction, said third holding unit and said fourth holding unit being movable away from each other in said second direction, said expansion sheet having a peripheral area around said workpiece where said expansion sheet is adapted to be held by said first holding unit, said second holding unit, said third holding unit, and said fourth holding unit;

said expansion sheet comprising:
a base sheet; and
an adhesive layer formed on said base sheet, said adhesive layer having adhesion adapted to be reduced by applying ultraviolet light;
the adhesion of said adhesive layer in said peripheral area of said expansion sheet being lower than the adhesion of said adhesive layer in the other area of said expansion sheet;
wherein said expansion sheet is elongated and formed as a sheet roll;
said expansion sheet as said sheet roll being rolled in said first direction;
said peripheral area of said expansion sheet including a plurality of first low adhesion areas arranged at given intervals in said first direction, each first low adhesion area extending in said second direction over the entire width of said base sheet, and a pair of second low adhesion areas extending in said first direction along the opposite side edges of said base sheet.

2. An expanding method for an expansion sheet including a base sheet and an adhesive layer formed on said base sheet, said adhesive layer having adhesion adapted to be reduced by applying ultraviolet light, said expanding method comprising:

a first attaching step of attaching a platelike workpiece to said expansion sheet;
a holding step of holding said expansion sheet by using a first holding unit and a second holding unit opposed to each other with said workpiece interposed therebetween in a first direction and also by using a third holding unit and a fourth holding unit opposed to each other with said workpiece interposed therebetween in a second direction perpendicular to said first direction, before or after performing said first attaching step;
an expanding step of moving said first holding unit and said second holding unit away from each other in said first direction and also moving said third holding unit and said fourth holding unit away from each other in said second direction, after performing said first attaching step and said holding step, thereby expanding said expansion sheet both in said first direction and in said second direction;
a second attaching step of attaching an annular frame having an inside opening greater in size than said workpiece, to said expansion sheet in the condition where said workpiece is set in said inside opening of said annular frame, after performing said expanding step;
a cutting step of cutting said expansion sheet along said annular frame after performing said second attaching step; and
an ultraviolet light applying step of selectively applying ultraviolet light to only a peripheral area of said expansion sheet where said expansion sheet is adapted to be held by said first holding unit, said second holding unit, said third holding unit, and said fourth holding unit, before performing said holding step, thereby reducing the adhesion of said adhesive layer in said peripheral area of said expansion sheet as compared with the adhesion of said adhesive layer in the other area of said expansion sheet.

\* \* \* \* \*